(12) United States Patent
Grieder et al.

(10) Patent No.: US 6,824,041 B2
(45) Date of Patent: Nov. 30, 2004

(54) HIGH TEMPERATURE EUTECTIC SOLDER BALL ATTACH

(75) Inventors: Andrew Grieder, Larkspur, CO (US); Alexander Lazar, Stuttgart (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/274,749

(22) Filed: Oct. 21, 2002

(65) Prior Publication Data

US 2004/0074950 A1 Apr. 22, 2004

(51) Int. Cl.[7] ............................ B23K 31/02; H01L 23/48
(52) U.S. Cl. .................... 228/180.22; 257/738
(58) Field of Search .................. 228/180.22, 245, 228/246; 257/737, 738; 438/613

(56) References Cited

U.S. PATENT DOCUMENTS 5,919,329 A * 7/1999 Banks et al. ................ 156/281
5,968,670 A * 10/1999 Brofman et al. ............. 428/576
6,053,394 A * 4/2000 Dockerty et al. ....... 228/180.22
6,350,669 B1 * 2/2002 Pu et al. ..................... 438/613

FOREIGN PATENT DOCUMENTS

| JP | 408316619 A | * | 11/1996 |
| JP | 10256308 A | * | 9/1998 |
| JP | 10335533 A | * | 12/1998 |
| JP | 11204569 A | * | 7/1999 |
| JP | 11243156 A | * | 9/1999 |

OTHER PUBLICATIONS

Derwent-ACC-NO: 2000-463397.*

* cited by examiner

Primary Examiner—Kiley S. Stoner
(74) Attorney, Agent, or Firm—Cynthia S. Mitchell

(57) ABSTRACT

High melt balls dispersed on the surface of a ball grid array package in such a manner that the collapse of eutectic solder balls is controlled during reflow heating in order to ensure appropriate solder ball standoff, pitch and coplanarity of the ball grid array package from the substrate or printed circuit board surface to which it is being attached.

10 Claims, 5 Drawing Sheets

HIGH TEMPERATURE EUTECTIC SOLDER BALL ATTACH

FIELD OF THE INVENTION

The present invention pertains generally to the field of semiconductors, and more particularly to a method of attaching electronic components to substrates.

BACKGROUND OF THE INVENTION

In recent years, flip-chip and ball grid array techniques have increasingly been used to connect integrated circuit (IC) chips to interconnection substrates, such as printed circuit boards and to package substrates. In flip-chip bonding an IC chip component to a interconnection substrate or printed circuit board, a plurality (e.g., an array) of solder balls (also known as "solder bumps") are formed on a surface of a component, typically the IC chip component, and the bumped component is brought into a face-to-face relationship with the other component. The two components are then heated (such as in a furnace) to reflow (heat, then allow to cool) the solder bumps between the two components, thereby making electrical connections between respective terminals of the two components.

A need for ever finer pitch arrays of solder balls has accompanied an increase in the circuit density of IC chips and multi-chip modules. For example, an IC chip to be flip-chip connected to an interconnection substrate may require an array of 4 mil diameter solder balls disposed at an 8 mil pitch.

A "solder ball" refers to a substantially spherical or hemispherical mass or bump of solder (e.g., a lead-tin solder) resident on a substrate (e.g., electronic component), suitable for being re-flowed to join the electronic component to another electronic component. The term "pitch" refers to the distance between centers of adjacent solder balls on pads of a substrate. The following units and their equivalents are also used herein: 1 mil=0.001 inches; 1 micron=0.000001 meters; 25.4 microns=1 mil; 1 millimeter=0.001 meters.

As used herein, a "substrate" is an electronic component having a nominally flat surface upon which it is desirable to form solder balls to effect electrical connections to another electronic component. Ball grid array (BGA) substrates are substrates. As used herein, the terms "substrate bumping" and "ball bumping" refer to a process for forming solder balls on substrates.

The eutectic solder balls on heavy depopulated IC ball grid array packages tend to collapse excessively during reflow. This causes the balls to be short and wide, which can cause bridging problems and shorts.

Accordingly, there exists a need in the industry for a means to limit or control the collapse of eutectic solder balls during the reflow assembly process.

SUMMARY OF THE INVENTION

The apparatus comprise high melt balls on an electronic component surface to control the collapse of the eutectic solder balls on a BGA during the reflow process. The high melt balls also ensure coplanarity, consistent device standoff for rework, tighter pitch of solder balls and higher standoff for reliability.

A method for controlling the collapse of eutectic solder balls during the reflow manufacturing process by providing one or more high melt solder balls that limit the eutectic solder ball collapse and ensure coplanarity of the electronic component surface with the substrate surface.

An electronic assembly comprising an electronic component having a first surface attached to a first surface of a substrate, wherein the first surface of the electronic component is attached to the first surface of the substrate according to the following steps: forming an array of eutectic solder balls across the first surface of the electronic component; forming more than one high melt ball with a predetermined diameter on the first surface of the electronic component; bringing the eutectic solder balls into contact with the first surface of the substrate; and heating the eutectic solder balls without melting the high melt balls, such that the eutectic solder balls compress to the standoff of the diameter of the high melt balls.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
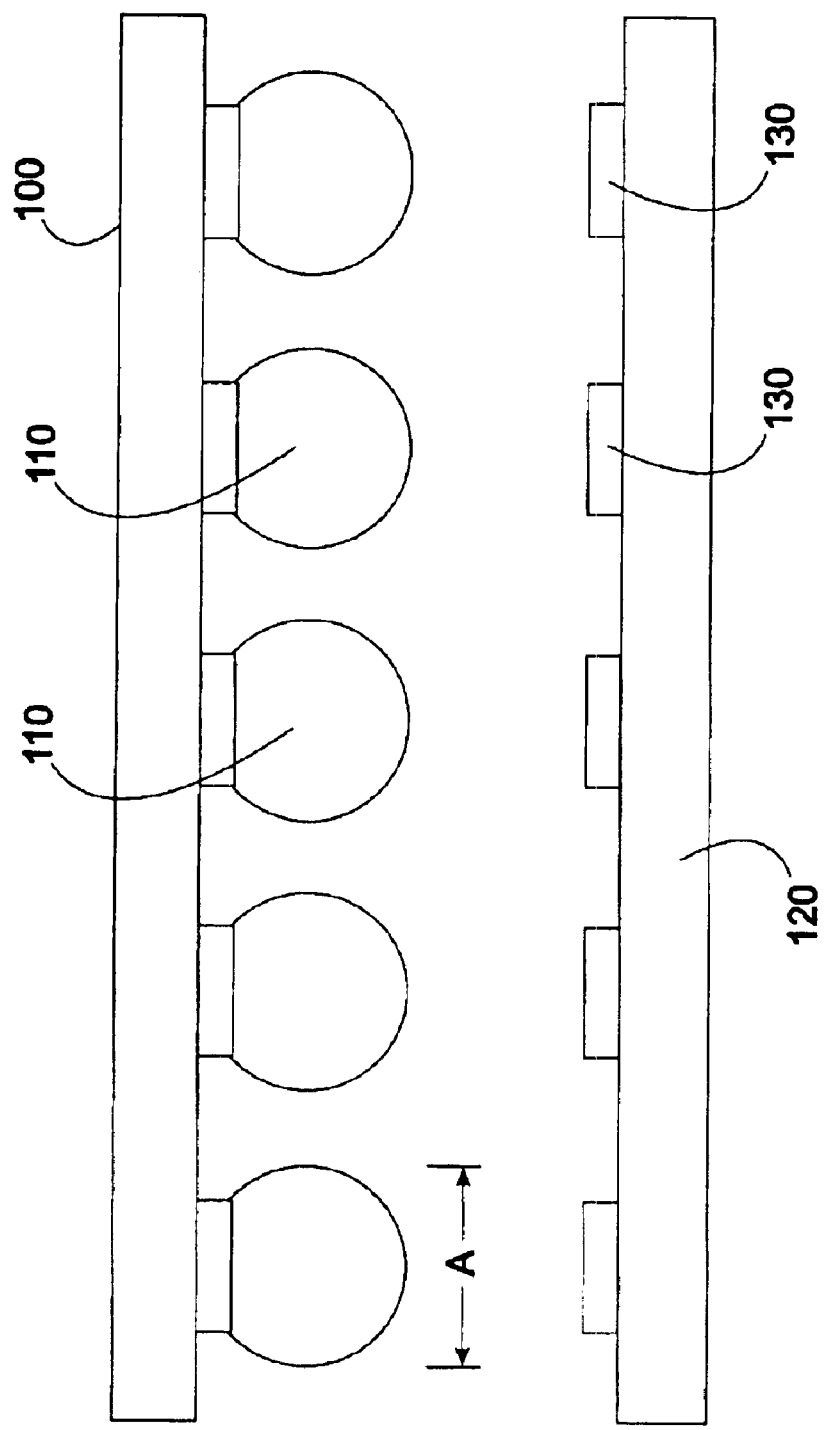
FIG. 1 illustrates a cross-sectional view of a BGA package and substrate prior to reflow.

As shown in the drawings for purposes of illustration, the present invention relates to techniques for providing method for controlling the collapse of eutectic solder balls during a reflow heating process.

Turning now to the drawings, FIG. 1 illustrates a cross-sectional view of a typical BGA package 100 with eutectic solder balls 110. Eutectic solder balls 110 are generally made of tin/silver/lead, such as 62% tin, 2% silver and 36% lead. Other combinations are possible, such as 63% lead, 37% tin. Most standard solder materials have a melting temperature of approximately 175–190 degrees Celsius. Typically, solder balls 110 have a diameter of approximately 15–35 mils prior to the reflow process.

Figure 2:
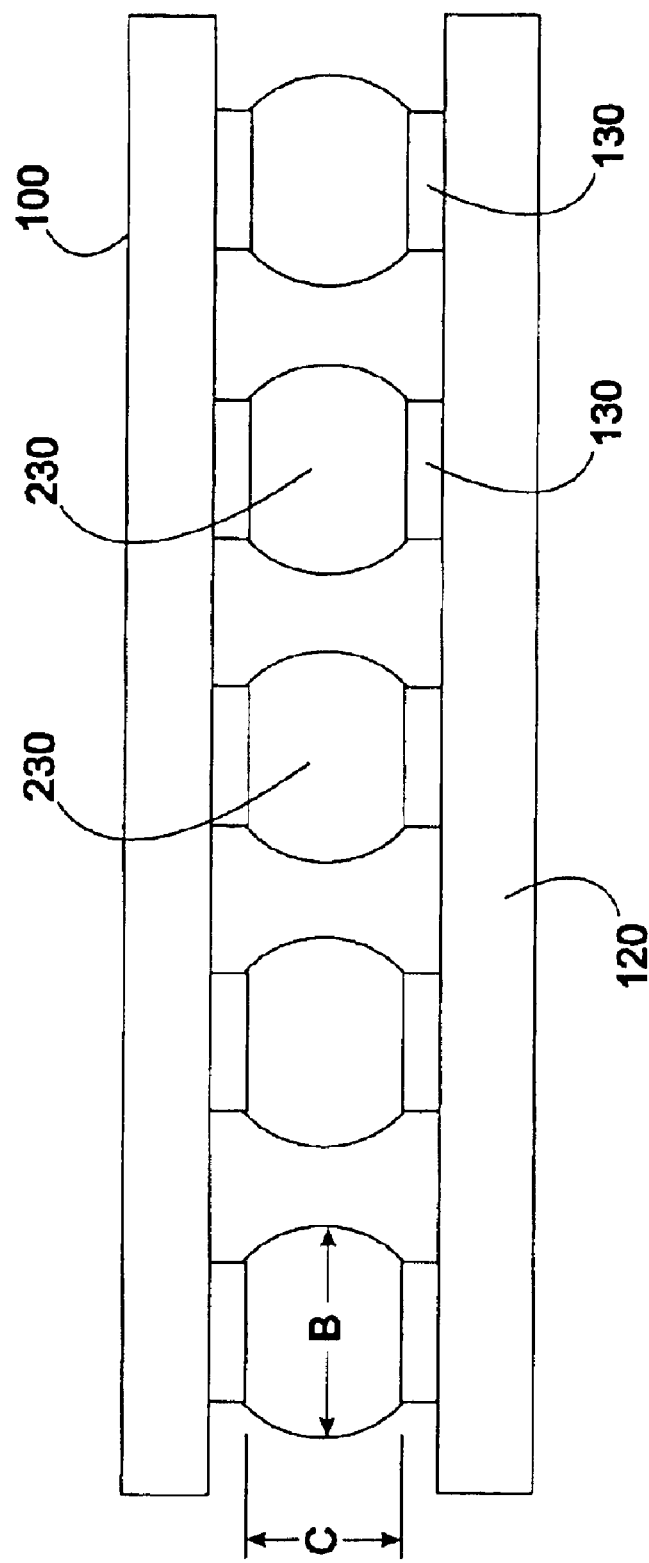
FIG. 2 illustrates a cross-sectional view of a BGA package and substrate after reflow.

FIG. 2 shows a cross-sectional view of a typical BGA package 100 with eutectic solder balls 230 after the reflow process, in which the solder balls 110 were brought into contact with a plurality contact pads 130 on a substrate, such as a printed circuit board 120 and heated during a reflow heating process, in which the eutectic solder balls liquefy and attached to contact pads 130. During this process, the weight of the BGA package 100 may cause the solder balls 110 to collapse down to solder balls 230 having a stand-off or height "C" of approximately 30–50% of the original solder ball 230 diameter. Solder balls 230 may have a width of approximately 1–2 times the original solder ball 230 diameter after the reflow process. This may cause bridging or shorting between solder balls 230. This collapse of solder balls 110 may become excessive, especially in the case of heavily depopulated packages 100.

Figure 3:
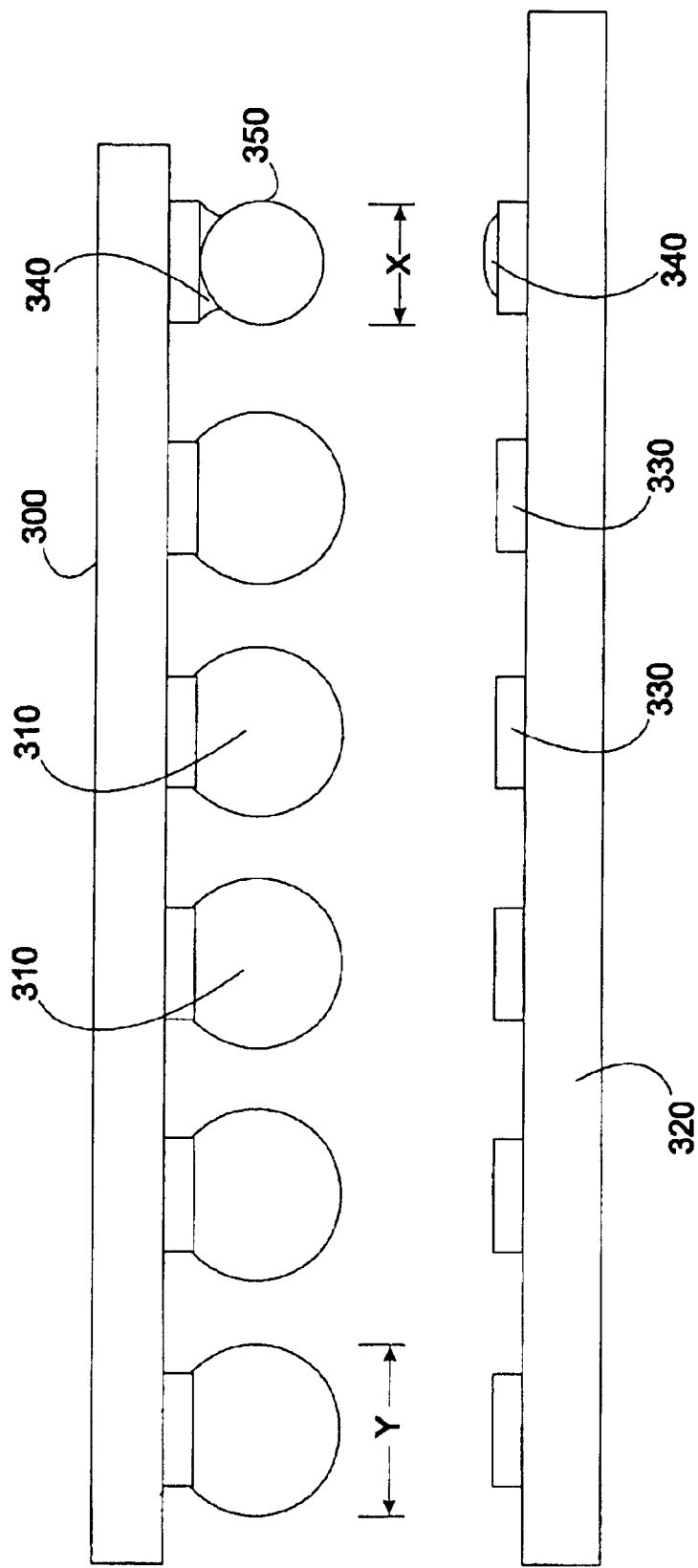
FIG. 3 illustrates a cross-sectional view of a BGA package and substrate prior to reflow in accordance with the present invention.

FIG. 3 shows a cross-sectional view of a BGA package 300, according to the present invention, with a plurality of eutectic solder balls 310 having an initial diameter "Y" of approximately 25 mils prior to reflow heating and at least one high melt ball 350 having an initial diameter "X" of approximately 20 mils prior to reflow heating. Eutectic solder balls 310 may be 62% tin, 2% silver and 36% lead. High melt balls 350 may be 90% lead and 10% tin. When a standard reflow heating temperature of 175–190 degrees Celsius is used, the high melt balls 350 do not reflow, so eutectic paste 340 is used between the high melt balls 350 and contact pads 330 to ensure attachment.

Figure 4:
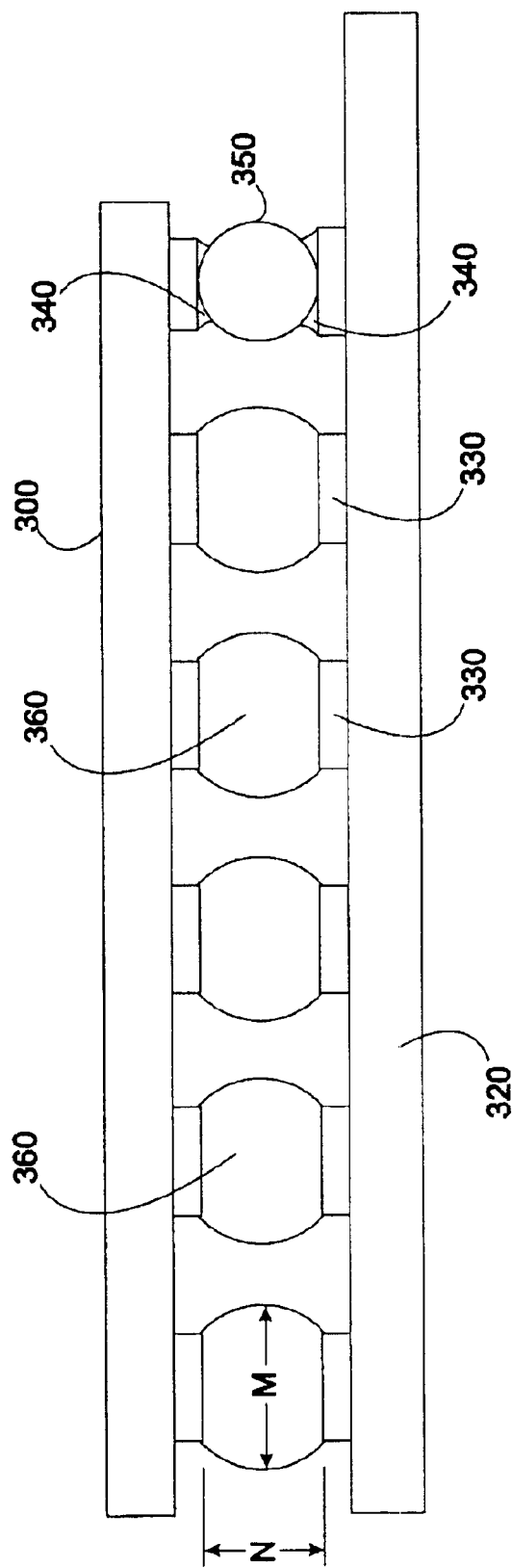
FIG. 4 illustrates a cross-sectional view of a BGA package and substrate after reflow in accordance with the present invention.

With reference to FIG. 4 a cross-sectional view of the BGA package 300 attached to substrate 320 after reflow heating is seen. Stretch eutectic solder balls 310 have collapsed to solder balls 360 having a standoff height "N" of approximately 20 mils. Post reflow solder balls 360 have a diameter "M" of approximately 22 mils. This permits approximately a 20% increase in spacing between the solder balls. Alternatively the solder ball array pitch may be tightened by approximately 20%. The technique also has the advantage of higher standoff, which increases the reliability. It also permits a wider rework process window by ensuring that the package remains parallel to the printed circuit board on re-attach. One option is to have at least one high melt ball 350 in each corner of the BGA package 300. Alternatively three or more high melt balls 350 may be located at any convenient location(s) on the BGA. Preferably, the high melt balls 350 will be spaced in such a manner to ensure coplanarity of BGA 300 following the reflow heating process.

Figure 5:
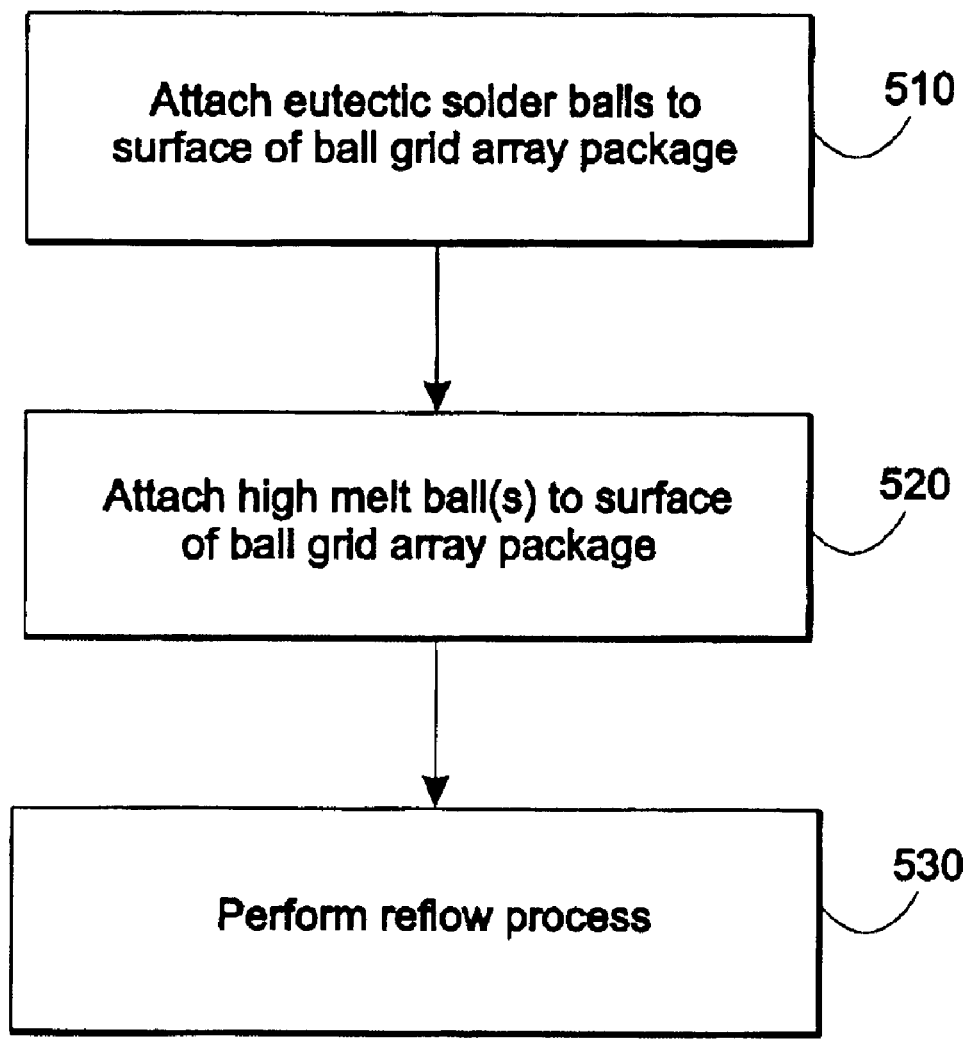
FIG. 5 illustrates a flow chart for a process to control the collapse of eutectic solder balls during manufacturing.

Referring now to FIG. 5 a flow chart illustrates the process of the present invention, in which eutectic solder balls 310 are attached 510 to the surface of a BGA 300 by any known method. High melt balls 350 are attached 520 to the same surface of the BGA 300 by means of eutectic paste 340 or other known attachment method. The eutectic solder balls are then brought into contact with fluxed contact pads 330 on a substrate 320, such as a printed circuit board in a sandwich type fashion. A standard reflow heating process is conducted, such as bringing the sandwich assembly to temperature of approximately 180–210 degrees Celsius until the eutectic solder balls 310 reflow and attach to the contact pads 330 of the substrate 320.

It will be appreciated from the above detailed description that the yield, pitch, and reliability of the BGA solder ball array may be adjusted by adjusting the standoff of the original pre-reflow solder balls, the compound make-up of the stretch eutectic solder balls 310, compound of the high melt balls 350, the reflow heating temperature or reflow process length. Modifying each of these components is fully contemplated within the scope of the present invention and does not depart from the general concept of the invention to have one or more high melt balls 350 dispersed in a pattern on the surface of a BGA package 300 to control the collapse of the solder balls 310 during the reflow heating process to permit higher standoff, tighter pitch between solder balls 360 and to ensure coplanarity of the BGA package 300 after the reflow heating process and if necessary after a rework process.

Although this preferred embodiment of the present invention has been disclosed for illustrative purposes, those skilled in the art will appreciate that various modifications, additions and substitutions are possible, without departing from the scope and spirit of the invention, resulting in equivalent embodiments that remain within the scope of the appended claims.

What is claimed is:

1. A ball grid array package, comprising:
   an array of eutectic solder balls on a surface of the ball grid array package; and
   at least one high melt ball on the same surface of the BGA package, wherein said at least one high melt ball has pre-flow diameter of approximately 15–20 mils.

2. The ball grid array package in accordance with claim 1, wherein said at least one high melt ball is at least one high melt ball in each corner of said surface of said ball grid array package.

3. A ball grid array package, comprising:
   an array of eutectic solder balls on a surface of the ball grid array package; and
   at least one high melt ball on a surface of the BGA package, wherein said eutectic solder balls comprise approximately, 62% tin, 2% silver, and 36% lead.

4. The ball grid array package in accordance with claim 1, wherein said at least one high melt ball comprises approximately 90% lead and 10% tin.

5. The ball grid array package in accordance with claim 1, wherein said at least one high melt ball has a melting point high enough that it does not reflow during a normal reflow heating process to reflow the eutectic solder balls.

6. A hail grid array package comprising:
   an array of eutectic solder balls on a surface of the ball grid array package; and
   at least one high melt ball on the same surface of the BGA package, wherein said eutectic solder balls have a pre-reflow diameter of approximately 20–25 mils and a post-reflow standoff of approximately 15–20 mils.

7. A ball grid array package comprising:
   an array of eutectic solder ball on the ball grid array package; and
   at least one high melt on the same surface of the BGA package, wherein said eutectic solder balls have a post-reflow standoff of approximately 15–20 mils.

8. The ball grid array package in accordance with claim 7, wherein said at least one high melt ball has a pre-reflow diameter of approximately 20 mils.

9. An electronic assembly having a first surface, said electronic assembly comprising:
   an array of eutectic solder balls arranged on said first surface;
   at least one high melt ball on said first surface of said electronic assembly, wherein in array of eutectic solder balls have post-reflow standoff of approximately 20–25 mils.

10. An electronic assembly comprising an electronic component having a first surface attached to a first surface of a substrate, wherein the first surface of the electronic component is attached to the first surface of the substrate according to the following steps:
    forming an array of eutectic solder balls across the first surface of the electronic component;
    forming more than one high melt ball with a predetermined diameter on the first surface of the electronic component;
    bringing the eutectic solder balls into contact with the first surface of the substrate; and
    heating the eutectic solder balls without melting the high melt balls, such that the eutectic solder balls compress to the standoff of the diameter of the high melt balls, wherein said array of eutectic solder balls have a post-reflow standoff of approximately 20–25 mils.

* * * * *